United States Patent
Mimino

(10) Patent No.: US 12,149,171 B2
(45) Date of Patent: Nov. 19, 2024

(54) SWITCHING POWER SUPPLY INCLUDING WIRING LAYER

(71) Applicant: ROHM CO., LTD., Kyoto (JP)

(72) Inventor: Yutaka Mimino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 195 days.

(21) Appl. No.: 17/864,794

(22) Filed: Jul. 14, 2022

(65) Prior Publication Data

US 2022/0416658 A1 Dec. 29, 2022

Related U.S. Application Data

(63) Continuation of application No. PCT/JP2021/000164, filed on Jan. 6, 2021.

(30) Foreign Application Priority Data

Jan. 14, 2020 (JP) .................. 2020-003934

(51) Int. Cl.
*H02M 3/158* (2006.01)
*H02M 7/00* (2006.01)
*H05K 1/18* (2006.01)

(52) U.S. Cl.
CPC .......... *H02M 3/158* (2013.01); *H02M 7/003* (2013.01); *H05K 1/182* (2013.01); *H05K 2201/09063* (2013.01); *H05K 2201/093* (2013.01)

(58) Field of Classification Search
CPC ..... G06F 1/263; H02M 1/10; H02M 3/33561; H02M 7/003; H02M 5/2573; H02M 1/081;

(Continued)

(56) References Cited

U.S. PATENT DOCUMENTS 11,678,468 B2 * 6/2023 Blanchard St-Jacques ................. H01L 25/0655 361/677
2014/0368109 A1 * 12/2014 Goscha .................. H01J 9/323 315/34

(Continued)

FOREIGN PATENT DOCUMENTS

JP H05145266 A 6/1993
JP 2007049330 A 2/2007

(Continued)

OTHER PUBLICATIONS

International Preliminary Report of Patentability for corresponding International Application No. PCT/JP2021/000164; Mailing Date Feb. 16, 2021.

(Continued)

*Primary Examiner* — Thienvu V Tran
*Assistant Examiner* — Nusrat Quddus
(74) *Attorney, Agent, or Firm* — CANTOR COLBURN LLP

(57) ABSTRACT

A switching power supply is mounted on a printed circuit board. A first wiring layer of the printed circuit board includes a DC line through which a DC voltage is supplied, and a first ground region and a second ground region formed at a distance from the DC line and with the DC line interposed between them. A lower-layer ground region is formed in a second wiring layer. An insulating layer includes multiple first through holes provided along one side of the first ground region so as to electrically connect the first ground region and the lower-layer ground region, and multiple second through holes provided along one side of the second ground region so as to electrically connect the second ground region and the lower-layer ground region.

8 Claims, 10 Drawing Sheets

(58) Field of Classification Search
CPC .......... H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/1584; H02M 3/285; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 3/07; H02M 3/073; H02M 2003/071; H02M 2003/072; H02M 2003/075; H02M 2003/076; H02M 2003/077; H02M 2003/078; H02M 2001/0048; H01L 25/112; H01L 25/115; H01L 23/34; H01R 13/6675; H01R 29/00; H01R 31/065; G09G 3/20; H02K 11/046; H01F 2027/406; H05K 7/20927; G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H05B 39/048; B23K 11/24; H04B 2215/069; H02J 3/46; H02J 3/38

See application file for complete search history.

(56) References Cited

U.S. PATENT DOCUMENTS

| | | | | |
|---|---|---|---|---|
| 2016/0058206 | A1* | 3/2016 | Schwalbach | H02J 7/0042 361/752 |
| 2017/0331371 | A1* | 11/2017 | Parto | G06F 1/26 |
| 2019/0097458 | A1* | 3/2019 | Oh | H01F 38/14 |
| 2020/0411494 | A1* | 12/2020 | Hovis | H01L 23/481 |

FOREIGN PATENT DOCUMENTS

| | | |
|---|---|---|
| JP | 2015222918 A | 12/2015 |
| JP | 2016225513 A | 12/2016 |
| JP | 6142933 B1 | 6/2017 |

OTHER PUBLICATIONS

International Search Report for International Application No. PCT/JP2021/000164; Mailing Date of Feb. 16, 2021.

JPO Notification of Reasons for Refusal for corresponding JP Application No. 2021-571152; dated Jun. 11, 2024; 2 pages.

\* cited by examiner

<Prior Art>

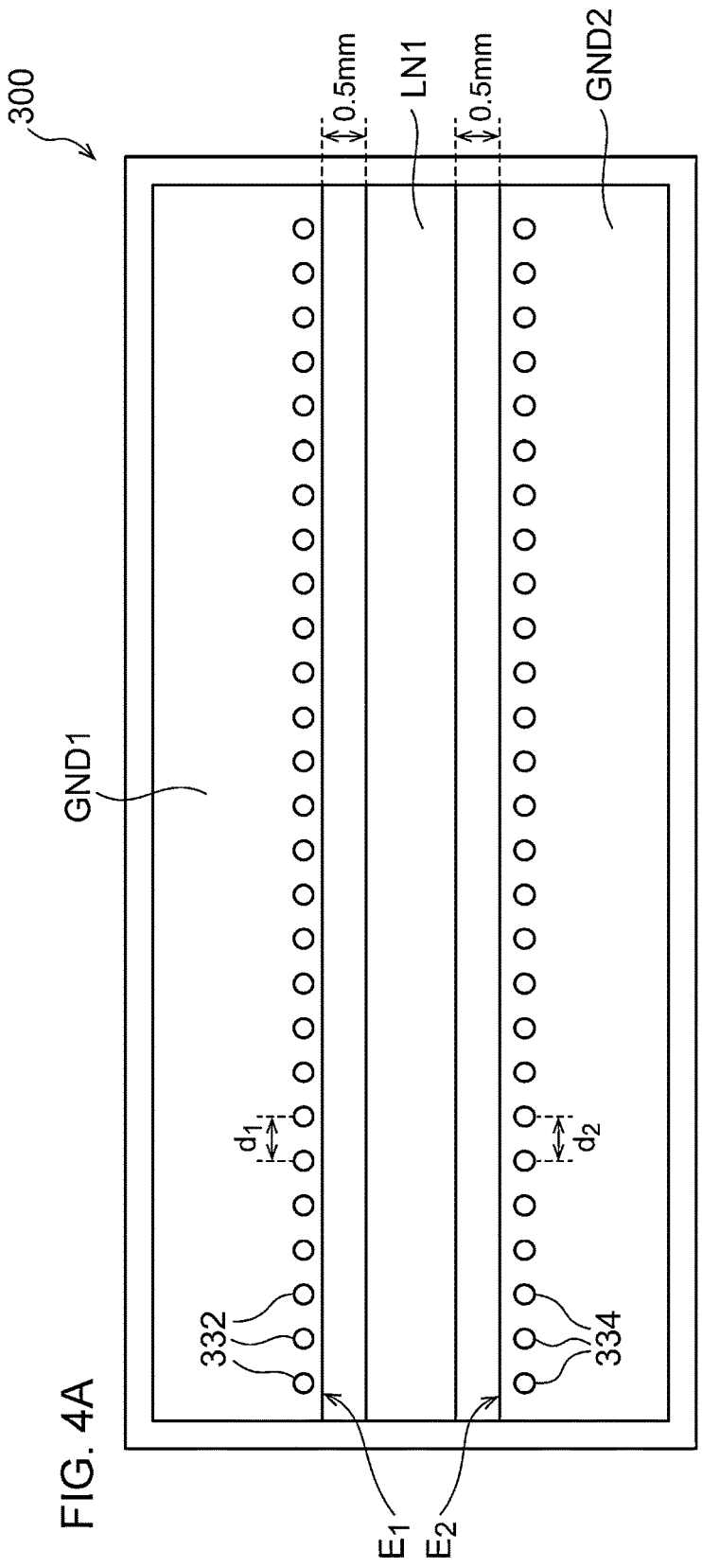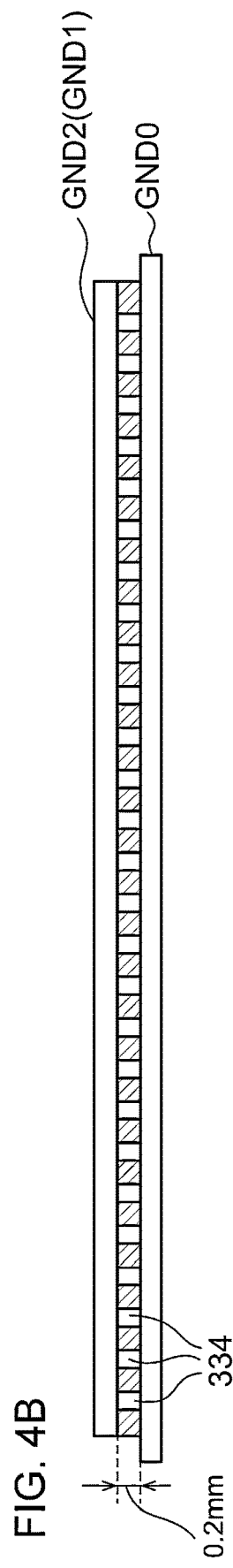
FIG. 4A
FIG. 4B

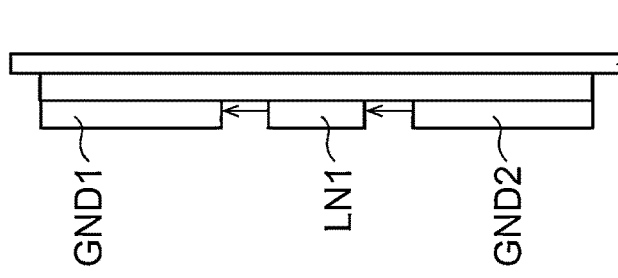
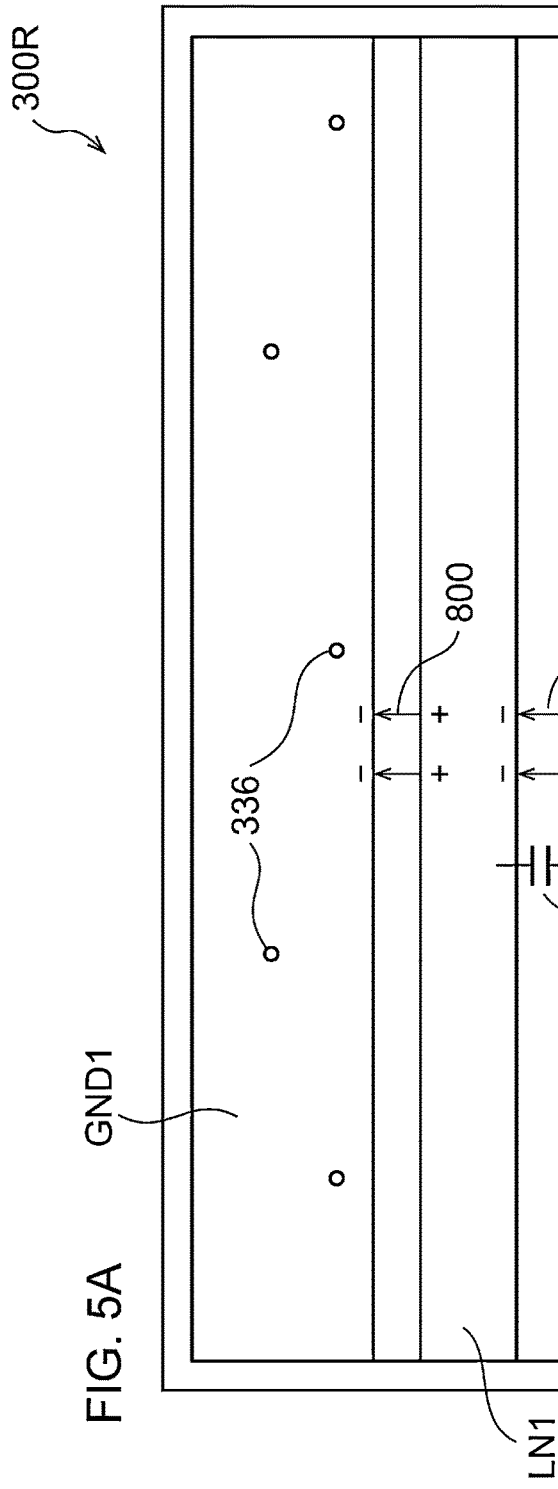
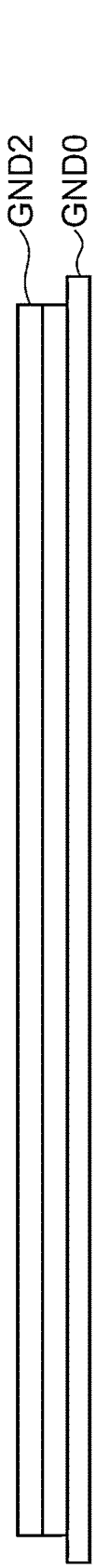

SWITCHING POWER SUPPLY INCLUDING WIRING LAYER

CROSS REFERENCE TO RELATED APPLICATIONS

This application is a continuation under 35 U.S.C. § 120 of PCT/JP2021/000164, filed Jan. 6, 2021, which is incorporated herein by reference, and which claimed priority to Japanese Application No. 2020-003934, filed Jan. 14, 2020. The present application likewise claims priority under 35 U.S.C. § 119 to Japanese Application No. 2020-003934, filed Jan. 14, 2020, the entire content of which is also incorporated herein by reference.

BACKGROUND

1. Technical Field

The present invention relates to a switching power supply.

2. Description of the Related Art

In various kinds of electronic devices, vehicles, and industrial equipment, a DC/DC converter is employed so as to convert a DC voltage having a given voltage value to a DC voltage having another voltage value. FIG. 1 is a circuit diagram showing a synchronous rectification step-down (buck) DC/DC converter 900. The DC/DC converter 900 receives a DC input voltage $V_{IN}$ via its input terminal 902 and generates a stepped-down output voltage $V_{OUT}$ at its output terminal 904. As an output stage of the DC/DC converter 900, a switching transistor M1, a synchronous rectification transistor M2, an inductor (coil) L1, and an output capacitor C1 are provided.

A pulse modulator 910 generates a pulse signal $S_{PWM}$ having a duty ratio, frequency, or a combination thereof that is changed such that the state of the DC/DC converter 900 or the state of a load (not shown) coupled to the output terminal 904 approaches a target state. A driver 912 switches on and off the switching transistor M1 and the synchronous rectification transistor M2 based on the pulse signal $S_{PWM}$.

For example, in a case in which the DC/DC converter 900 is configured to output a constant voltage, the pulse modulator 910 generates the pulse signal $S_{PWM}$ such that the output voltage $V_{OUT}$ approaches a target voltage $V_{OUT(REF)}$. It should be noted that, in a case in which the DC/DC converter 900 is configured to output a constant current, the pulse signal $S_{PWM}$ is generated such that the current $I_{OUT}$ that flows through the load approaches a target value $I_{REF}$. In the following explanation, description will be made regarding a converter configured to output a constant voltage.

Electronic devices are required to have an Electro-Magnetic Compatibility (EMC) characteristic, i.e., a non-interference characteristic that ensures that the electronic device itself has no adverse electromagnetic effect on another device and electromagnetic resistance that ensures that the electronic device itself is not adversely electromagnetically affected by another device. The former characteristic is evaluated as Electro-Magnetic Interference (EMI). The latter characteristic is evaluated as Electro-Magnetic Susceptibility (EMS).

The switching frequency of the DC/DC converter is on the order of at most several MHz. Accordingly, in conventional techniques, a printed circuit board is designed without employing an approach for high-frequency signals. That is to say, as a basic approach, wiring is designed to be short and thick.

The switching frequency of the DC/DC converter is on the order of several MHz. However, the switching voltage has a rectangular waveform. This leads to the occurrence of high-frequency noise of 100 MHz or more. Accordingly, it is difficult for conventional circuit board designing methods to meet a specification (e.g., CISPR 25 or the like developed by the International Special Committee on Radio Interference (CISPR)) required for in-vehicle components.

SUMMARY

An embodiment of the present disclosure has been made in order to solve such a problem.

An embodiment of the present disclosure relates to a switching power supply. The switching power supply includes: a printed circuit board having a multilayer structure including a first wiring layer structured as a surface layer, an insulating layer, and a second wiring layer; a control circuit mounted on the printed circuit board; and a peripheral circuit component group mounted on the printed circuit board. The first wiring layer includes: a DC line via which a DC voltage is supplied; and a first ground region and a second ground region each formed so as to be at a distance from the DC line such that the DC line is interposed between them. The second wiring layer includes a lower-layer ground region formed such that it overlaps the DC line, the first ground region, and the second ground region. The insulating layer includes: multiple first through holes provided along one side of the first ground region that faces the DC line so as to electrically connect the first ground region and the lower-layer ground region; and multiple second through holes provided along one side of the second ground region that faces the DC line so as to electrically connect the second ground region and the lower-layer ground region.

Another embodiment of the present disclosure also relates to a switching power supply. The switching power supply includes: a printed circuit board having a multilayer structure including a first wiring layer structured as a surface layer, an insulating layer, and a second wiring layer; a first control circuit mounted on the printed circuit board; and a first peripheral circuit component group mounted on the printed circuit board, so as to form a first DC/DC converter together with the first control circuit; a second control circuit mounted on the printed circuit board; and a second peripheral circuit component group mounted on the printed circuit board, so as to form a second DC/DC converter together with the second control circuit. The output voltage of the first DC/DC converter is supplied to an input terminal of the second DC/DC converter. The first wiring layer includes: a first DC line via which an input voltage of the first DC/DC converter is supplied; a first ground region and a second ground region each formed so as to be at a distance from the first DC line such that the first DC line is interposed between them; a second DC line that couples an output terminal of the first DC/DC converter and an input terminal of the second DC/DC converter; and a third ground region and a fourth ground region each formed so as to be at a distance from the second DC line such that the second DC line is interposed between them. The second wiring layer includes a lower-layer ground region formed such that it overlaps the first DC line, the first ground region, the second ground region, the second DC line, the third ground region, and the fourth ground region. The insulating layer includes: multiple first through holes provided along one side of the first ground region that faces the first DC line so as to electrically connect the first ground region and the lower-layer ground region; multiple second through holes provided along one side of the second ground region that faces the first DC line so as to electrically connect the second ground region and the lower-layer ground region; multiple third through holes provided along one side of the third ground region that faces the second DC line so as to electrically connect the third ground region and the lower-layer ground region; and multiple fourth through holes provided along one side of the fourth ground region that faces the second DC line so as to electrically connect the fourth ground region and the lower-layer ground region.

It should be noted that any combination of the components described above or any components or manifestation of the present invention may be mutually substituted between a method, apparatus, system, and so forth, which are also effective as an embodiment of the present invention.

BRIEF DESCRIPTION OF THE DRAWINGS

FIG. 4A and FIG. 4B are a plan view and a cross-sectional view of the printed circuit board.

FIGS. 5A, FIG. 5B, and FIG. 5C are diagrams showing a printed circuit board according to a comparison technique.

DETAILED DESCRIPTION

Outline of Embodiments

Figure 1:
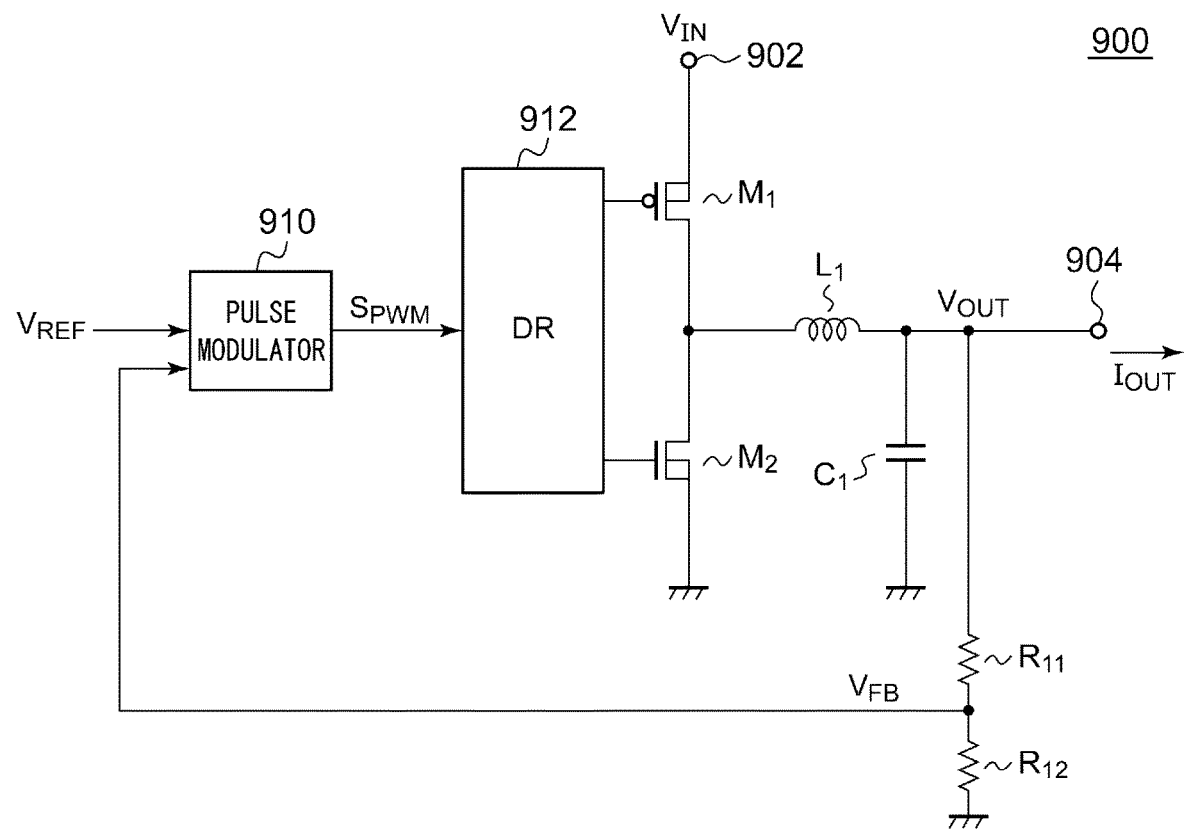
FIG. 1 is a circuit diagram showing a step-down (buck) DC/DC converter.

Description will be made regarding an outline of several example embodiments of the present disclosure. In this outline, some concepts of one or more embodiments will be described in a simplified form as a prelude to the more detailed description that is presented later in order to provide a basic understanding of such embodiments. Accordingly, the outline is by no means intended to restrict the scope of the present invention or the present disclosure. Furthermore, this outline is not an extensive overview of all conceivable embodiments, and is by no means intended to restrict essential elements of the embodiments. For convenience, the term "one embodiment" may be used herein to refer to a single embodiment or multiple embodiments disclosed in the present specification.

A switching power supply according to one embodiment includes: a printed circuit board having a multilayer structure including a first wiring layer structured as a surface layer, an insulating layer, and a second wiring layer; a control circuit mounted on the printed circuit board; and a peripheral circuit component group mounted on the printed circuit board. The first wiring layer includes: a DC line via which a DC voltage is supplied; and a first ground region and a second ground region each formed so as to be at a distance from the DC line such that the DC line is interposed between them. The second wiring layer includes a lower-layer ground region formed such that it overlaps the DC line, the first ground region, and the second ground region. The insulating layer includes: multiple first through holes provided along one side of the first ground region that faces the DC line so as to electrically connect the first ground region and the lower-layer ground region; and multiple second through holes provided along one side of the second ground region that faces the DC line so as to electrically connect the second ground region and the lower-layer ground region.

With this arrangement, the first ground region and the lower-layer ground region are connected with low impedance in the vicinity of the DC line. Furthermore, the second ground region and the lower-layer ground region are connected with low impedance in the vicinity of the DC line. This allows the first ground region, the second ground region, and the lower-layer ground region to be maintained at an equal electric potential in the high-frequency range. This is capable of suppressing radiation noise and conduction noise.

In one embodiment, with the speed of light in a vacuum as c, with the maximum frequency defined in a specification with respect to noise as $f_{MAX}$, and with the relative dielectric constant of the insulating layer as $\varepsilon_r$, the maximum value $d_{max}$ of pitches of the first through holes and the second through holes may be determined such that $d_{max} < (c/(f_{MAX} \cdot \sqrt{\varepsilon_r}))/10$ is satisfied. This provides an effect of suppressing radiation noise and conduction noise in a high-frequency range in which it is difficult to provide a noise countermeasure.

In one embodiment, the minimum value $d_{min}$ of the pitches may be determined such that $(c/(f_{MAX} \cdot \sqrt{\varepsilon r}))/100 < d_{min}$ is satisfied.

In one embodiment, the DC line may be configured as an input line of the switching power supply.

In one embodiment, the switching power supply may further include an input filter provided on a path of the input line. The pitches of the first through holes and the second through holes on an upstream side of the input filter are designed to be wider than those on a downstream side of the input filter. The upstream side of the input filter has little effect on noise. Accordingly, by reducing the number of through holes, this allows the cost of the circuit board to be reduced while suppressing high-frequency noise.

In one embodiment, the switching power supply may be configured as a step-down DC/DC converter.

A switching power supply according to one embodiment includes: a printed circuit board having a multilayer structure including a first wiring layer structured as a surface layer, an insulating layer, and a second wiring layer; a first control circuit mounted on the printed circuit board; and a first peripheral circuit component group mounted on the printed circuit board, so as to form a first DC/DC converter together with the first control circuit; a second control circuit mounted on the printed circuit board; and a second peripheral circuit component group mounted on the printed circuit board, so as to form a second DC/DC converter together with the second control circuit. The output voltage of the first DC/DC converter is supplied to an input terminal of the second DC/DC converter. The first wiring layer includes: a first DC line via which an input voltage of the first DC/DC converter is supplied; a first ground region and a second ground region each formed so as to be at a distance from the first DC line such that the first DC line is interposed between them; a second DC line that couples an output terminal of the first DC/DC converter and an input terminal of the second DC/DC converter; and a third ground region and a fourth ground region each formed so as to be at a distance from the second DC line such that the second DC line is interposed between them. The second wiring layer includes a lower-layer ground region formed such that it overlaps the first DC line, the first ground region, the second ground region, the second DC line, the third ground region, and the fourth ground region. The insulating layer includes: multiple first through holes provided along one side of the first ground region that faces the first DC line so as to electrically connect the first ground region and the lower-layer ground region; multiple second through holes provided along one side of the second ground region that faces the first DC line so as to electrically connect the second ground region and the lower-layer ground region; multiple third through holes provided along one side of the third ground region that faces the second DC line so as to electrically connect the third ground region and the lower-layer ground region; and multiple fourth through holes provided along one side of the fourth ground region that faces the second DC line so as to electrically connect the fourth ground region and the lower-layer ground region.

Embodiments

Description will be made below regarding the present disclosure with reference to the drawings. In each drawing, the same or similar components, members, and processes are denoted by the same reference numerals, and redundant description thereof will be omitted as appropriate. The embodiments have been described for exemplary purposes only, and are by no means intended to restrict the present disclosure or invention. Also, it is not necessarily essential for the present disclosure or invention that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

In the present specification, the reference symbols denoting electric signals such as a voltage signal, current signal, or the like, and the reference symbols denoting circuit elements such as a resistor, capacitor, or the like, also represent the corresponding voltage value, current value, resistance value, or capacitance value as necessary.

Figure 2:
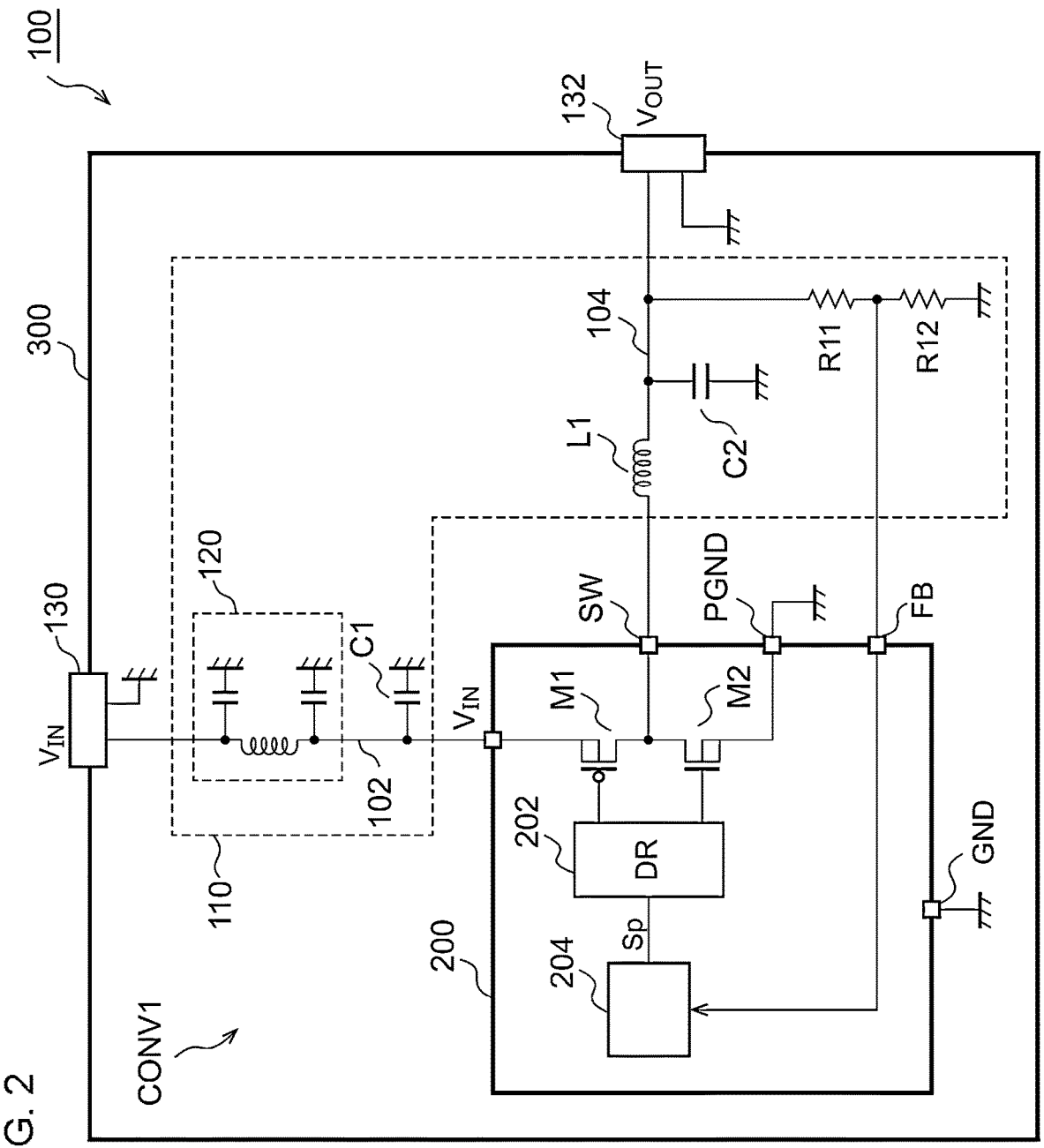
FIG. 2 is an equivalent circuit diagram of a switching power supply (switched-mode power supply) according to an embodiment.

FIG. 2 is an equivalent circuit diagram of a switching power supply (switched-mode power supply) 100 according to an embodiment. The switching power supply 100 is configured as a DC/DC converter, inverter, or the like. The switching power supply 100 is provided with a control circuit 200, a peripheral circuit component group 110, and a printed circuit board 300. Description will be made below regarding an example in which the switching power supply is configured as a step-down converter.

The control circuit 200 and the peripheral circuit component group 110 are mounted on the printed circuit board 300. The peripheral circuit component group 110 includes an inductor L1, an input capacitor C1, an output capacitor C2, an input filter 120, feedback resistors R11 and R12, etc. The peripheral circuit component group 110 forms a step-down converter CONV1 together with the control circuit 200.

The printed circuit board 300 is provided with connectors 130 and 132. An input voltage $V_{IN}$ of the step-down converter is supplied via the connector 130 from the exterior. Furthermore, an output voltage $V_{OUT}$ of the step-down converter is supplied to a load coupled to the output connector 132.

The control circuit 200 is configured as an Integrated Circuit (IC) that stabilizes the output of the DC/DC converter. Such an IC is commercially available from many chip vendors. In the present disclosure, the circuit configuration of the control circuit 200 and the package form are not restricted in particular.

The DC input voltage $V_{IN}$ is supplied to the input pin VIN of the control circuit 200 via an input line 102. The input capacitor C1 is coupled to the input line 102. Furthermore, the input filter 120 is provided on the input line 102. The inductor L1 is coupled to a switching pin SW. The other end of the inductor L1 is coupled to the connector 132 via an output line 104. The output capacitor C2 is coupled to the output line 104.

A switching transistor M1 is provided between the input pin VIN and the switching pin SW. A synchronous rectification transistor M2 is provided between the switching pin SW and a power ground pin PGND.

A signal $V_{FB}$ that corresponds to the output of the switching power supply 100 is fed back to a feedback pin FB of the control circuit 200. For example, the output of the switching power supply 100 may be an output voltage $V_{OUT}$ (voltage mode). Also, the output of the switching power supply 100 may be an output current $I_{OUT}$ (current mode).

In addition to the switching transistor M1 and the synchronous rectification transistor M2, the control circuit 200 further includes a driver 202, a pulse generator 204, an unshown protection circuit, etc. The pulse generator 204 generates a pulse signal Sp based on the feedback signal $V_{FB}$. The duty cycle or the frequency of the pulse signal Sp is feedback controlled such that the feedback signal $V_{FB}$ approaches its target value.

The configuration of the pulse generator 204 is not restricted in particular. For example, the pulse generator 204 may include an error amplifier that amplifies an error between the feedback signal and a reference voltage and a pulse modulator that generates a pulse signal having a duty cycle that corresponds to the output of the error amplifier. Alternatively, the pulse generator 204 may be configured using a ripple control method such as a hysteresis control method, bottom detection fixed on-time control method, peak detection fixed off-time control method, etc. Alternatively, the pulse generator 204 may be configured as a digital circuit, and may include a PI compensator.

The driver 202 drives the switching transistor M1 and the synchronous rectification transistor M2 based on the pulse signal Sp.

The above is the basic configuration of the switching power supply 100. Next, description will be made regarding a characteristic structure of the printed circuit board 300 of the switching power supply 100. The switching power supply 100 according to the present embodiment is characterized by a wiring structure and a ground pattern structure formed on the printed circuit board 300.

Figure 3:
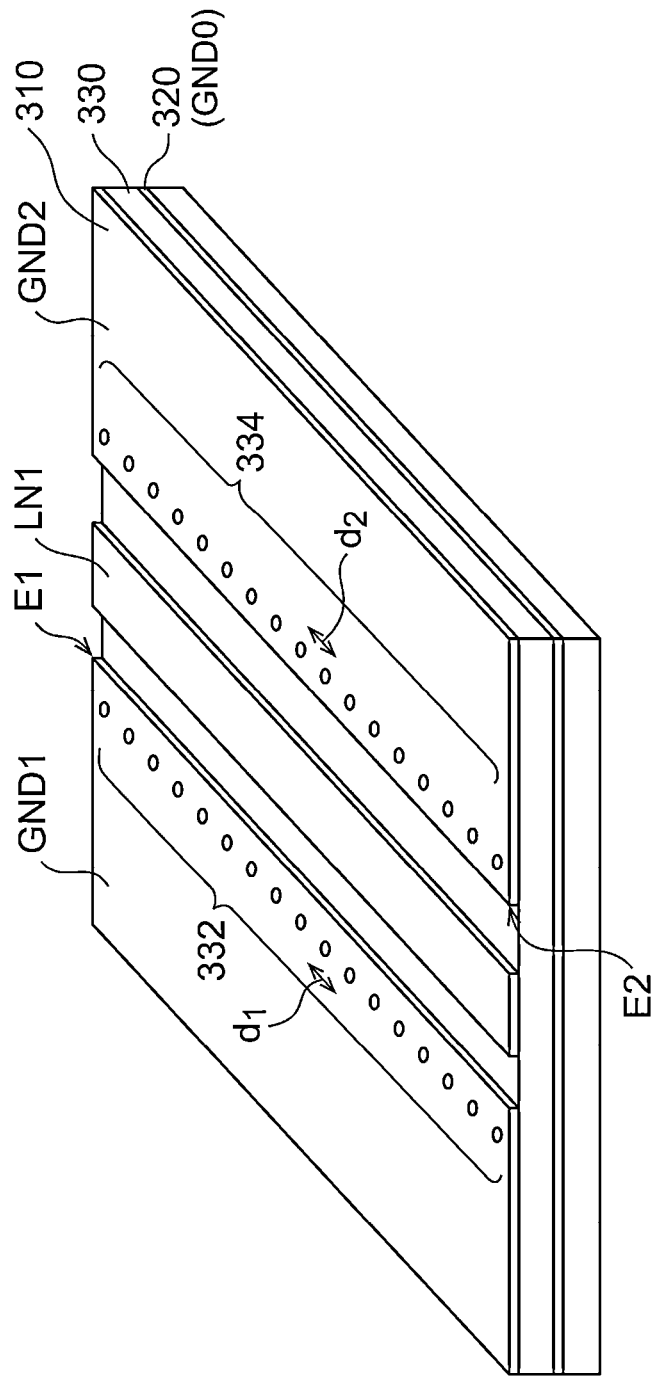
FIG. 3 is a simplified external perspective view of a printed circuit board.

FIG. 3 is a simplified external perspective view of the printed circuit board 300. The printed circuit board 300 has a multilayer structure including a first wiring layer 310, an insulating layer 330, and a second wiring layer 320. The kind of the printed circuit board 300 is not restricted in particular. For example, Flame Retardant Type 4 (FR4) is widely employed. The number of the wiring layers of the printed circuit board 300 is two or more. FIG. 3 shows a three-layer printed circuit board. FIG. 4A and FIG. 4B are a plan view and a cross-sectional view of the printed circuit board 300, respectively.

The first wiring layer 310 is configured as a wiring layer on the surface side. A major part of or all of the control circuit 200 and the peripheral circuit component group 110 is mounted on the first wiring layer 310. The circuit components are not shown in FIG. 3. Furthermore, ground regions and wiring (patterns) for electrically connecting pins or electrodes of two components are formed in the first wiring layer 310.

The first wiring layer 310 includes a DC line LN1 via which a DC voltage is supplied and a first ground region GND1 and a second ground region GND2 each formed so as to be at a distance from the DC line 312 such that the DC line LN1 is interposed between them. For example, the DC line LN1 corresponds to the input line 102 or the output line 104 shown in FIG. 2.

The interval between the DC line LN1 and the first ground region GND1 is several hundred μm to several mm. For example, the interval is on the order of 0.5 mm (500 μm). The same can be said of the interval between the DC line LN1 and the second ground region GND2.

The second wiring layer 320 includes a lower-layer ground region GND0 formed such that it overlaps the DC line LN1, the first ground region GND1, and the second ground region GND2. Also, the lower-layer ground region GND0 may be formed over the entire face of the second wiring layer 320.

Multiple first through holes 332 and multiple second through holes 334 are formed in the insulating layer 330. The insulating layer 330 is formed with a thickness of several hundred μm, for example. In many cases, substrates including the insulating layer 330 having a thickness of 0.1 mm to 0.3 mm are employed. FIG. 4B shows an arrangement in which the insulating layer 330 has a thickness of 0.2 mm. The multiple first through holes (which will also be referred to as a "first through hole group") 332 are provided to the first ground region GND along its side E1 that faces the DC line LN1 1, and electrically connect the first ground region GND1 and the lower-layer ground region GND0.

Furthermore, the multiple second through holes 334 (which will also be referred to as a "second through hole group") are provided to the second ground region GND2 along its side E2 that faces the DC line LN1, and electrically connect the second ground region GND2 and the lower-layer ground region GND0.

The pitch $d_1$ of the multiple first through holes 332 and the pitch $d_2$ of the second through holes 334 may preferably be designed to be as short as possible within a range allowed by the design rules of the printed circuit board 300. The pitches $d_1$ and $d_2$ may each be designed as a uniform pitch, and also may each be designed as a non-uniform pitch.

For example, the pitches $d_1$ and $d_2$ of the first through holes 332 and the second through holes 334 may be designed based on the frequency of noise to be handled. Typically, as the noise frequency becomes higher, it becomes more difficult to handle the noise. Accordingly, the pitches may be designed based on the maximum frequency $f_{max}$ defined in the specifications with respect to the noise. Specifically, with the maximum values of the pitches $d_1$ and $d_2$ as "$d_{max}$", $d_{max}$ may preferably be designed within a range represented by $d_{max} < (c/(f_{max} \cdot \sqrt{\varepsilon_r}))/10$.

Here, c represents the speed of light in a vacuum, and $\varepsilon_r$ represents the relative dielectric constant of the insulating layer 330. $c/(f_{max} \cdot \sqrt{\varepsilon_r})$ represents the wavelength of light within the insulating layer 330.

It should be noted that, in a case in which a large number of through holes are formed, in some cases, this leads to an increased cost. Furthermore, in a case in which the minimum value $d_{min}$ of the pitches $d_1$ and $d_2$ are designed to be excessively short, saturation occurs in the noise suppression effects. Therefore, the pitches $d_1$ and $d_2$ may be designed within the following range.

$$(c/(f_{max} \cdot \sqrt{\varepsilon_r}))/100 < d_{min}$$

For example, in a case in which the maximum frequency $f_{max}=1$ GHz, and $\vartheta_r=4$, the pitches $d_1$ and $d_2$ of the through holes may preferably be designed within a range represented by 1.5 mm<d<15 mm.

In the CISPR 25 standard, the limit values (allowed values) of conduction noise and radiation noise are defined in a band of 2.4 to 2.5 GHz giving consideration to wireless devices that conform to the Bluetooth (trademark) standard and IEEE 802.11 standard.

In a case in which the maximum frequency $f_{max}=2.5$ GHz, and $\varepsilon_r=4$, the pitches $d_1$ and d2 may preferably be designed within a range represented by 0.6 mm<d<6 mm.

In a case in which the noise suppression effects are to be further reinforced, the maximum value $d_{max}$ of the pitches $d_1$ and $d_2$ may preferably be designed such that the following relation holds true.

$$d_{max} < (c/(f_{max} \cdot \sqrt{\varepsilon_r}))/32$$

In this case, in a case in which the maximum frequency $f_{max}=2.5$ GHz, and $\varepsilon_r=4$, the pitches $d_1$ and $d_2$ may preferably be designed within a range represented by 0.6 mm<d<1.87 mm.

The above is the configuration of the printed circuit board 300. Next, description will be made regarding the effects thereof. The advantages of the printed circuit board 300 can be clearly understood in comparison with comparison techniques. Accordingly, first, description will be made regarding a comparison technique. FIGS. 5A, FIG. 5B, and FIG. 5C are diagrams showing a printed circuit board 300R according to a comparison technique. In the drawing, the arrows indicate lines of electric force.

In the same manner as the printed circuit board 300, the printed circuit board 300R includes a first ground region GND1, a second ground region GND2, and a lower-layer ground region GND0. The first ground region GND1 and the second ground region GND2 are electrically connected to the lower-layer ground region GND0 via through holes 336. However, in comparison with the embodiment, the pitch of the through holes 336 is designed to be markedly wider. Typically, the pitch of the through holes 336 is designed to be larger than 1 cm. In addition, the through holes 336 are not arranged along a side that faces the DC line LN1.

In FIG. 5A, the arrows indicate lines of electric force that can occur in the printed circuit board 300R. In the vicinity of the DC line LN1, the first ground region GND1 and the second ground region GND2 are not electrically connected to the lower-layer ground region GND0. Accordingly, the impedance between the first ground region GND1 and the lower-layer ground region GND0 and the impedance between the second ground region GND2 and the lower-layer ground region GND0 are larger than those in the embodiment. That is to say, with the printed circuit board 300R shown in FIG. 5A, this does not ensure that, in a high-frequency range, the first ground region GND1, the second ground region GND2, and the lower-layer ground region GND0 are maintained at an equal electric potential in the vicinity of the DC line LN1. Accordingly, in some cases, an electric potential distribution is formed such that lines of electric force 800 extend from the DC line LN1 toward the first ground region GND1 and lines of electric force 802 extend from the second ground region GND2 toward the DC line LN1. In this case, even if a bypass capacitor 804 is arranged as a noise filter between the DC line LN1 and the second ground region GND2, noise propagation occurs between the DC line LN1 and the first ground region GND1. Accordingly, such an arrangement is not capable of removing such noise.

Figure 6:
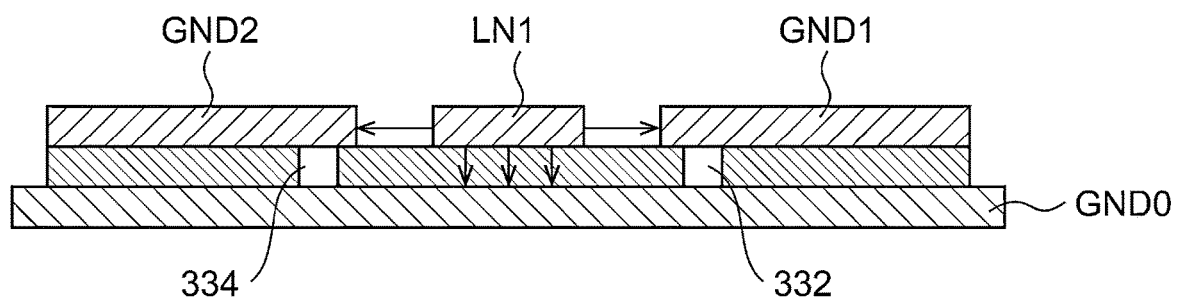
FIG. 6 is a diagram for explaining the principle of noise suppression provided by the printed circuit board.

Next, description will be made regarding noise suppression provided by the printed circuit board 300 according to the embodiment. FIG. 6 is a diagram for explaining the principle of noise suppression provided by the printed circuit board 300. In the drawing, the arrows indicate lines of electric force.

The ground regions GND1, GND2, and GND3, each configured to provide a reference electric potential, are formed on both sides and on the lower side of the DC line LN. The first ground region GND1 and the lower-layer ground region GND0 are electrically connected via densely arranged through holes. Furthermore, the second ground region GND2 and the lower-layer ground region GND0 are electrically connected via densely arranged through holes.

The grounds thus connected via the through holes 332 and 334 are maintained at an equal electric potential. Even if lines of electric force occur from the DC line LN1 at a certain time point, i.e., even if high-frequency noise occurs, such lines of electric force are terminated in the first ground region GND1, the second ground region GND2, and the lower-layer ground region GND0. Accordingly, this allows the high-frequency noise to be confined in the vicinity of the DC line LN1. This is capable of suppressing radiation noise and conduction noise.

The present disclosure encompasses various kinds of apparatuses and methods that can be derived from the aforementioned description. That is to say, the present disclosure is not restricted to a specific configuration. More specific description will be made below regarding example configurations or examples for clarification and ease of understanding of the essence of the present disclosure and the operation thereof. That is to say, the following description will by no means be intended to restrict the technical scope of the present disclosure.

Figure 7:
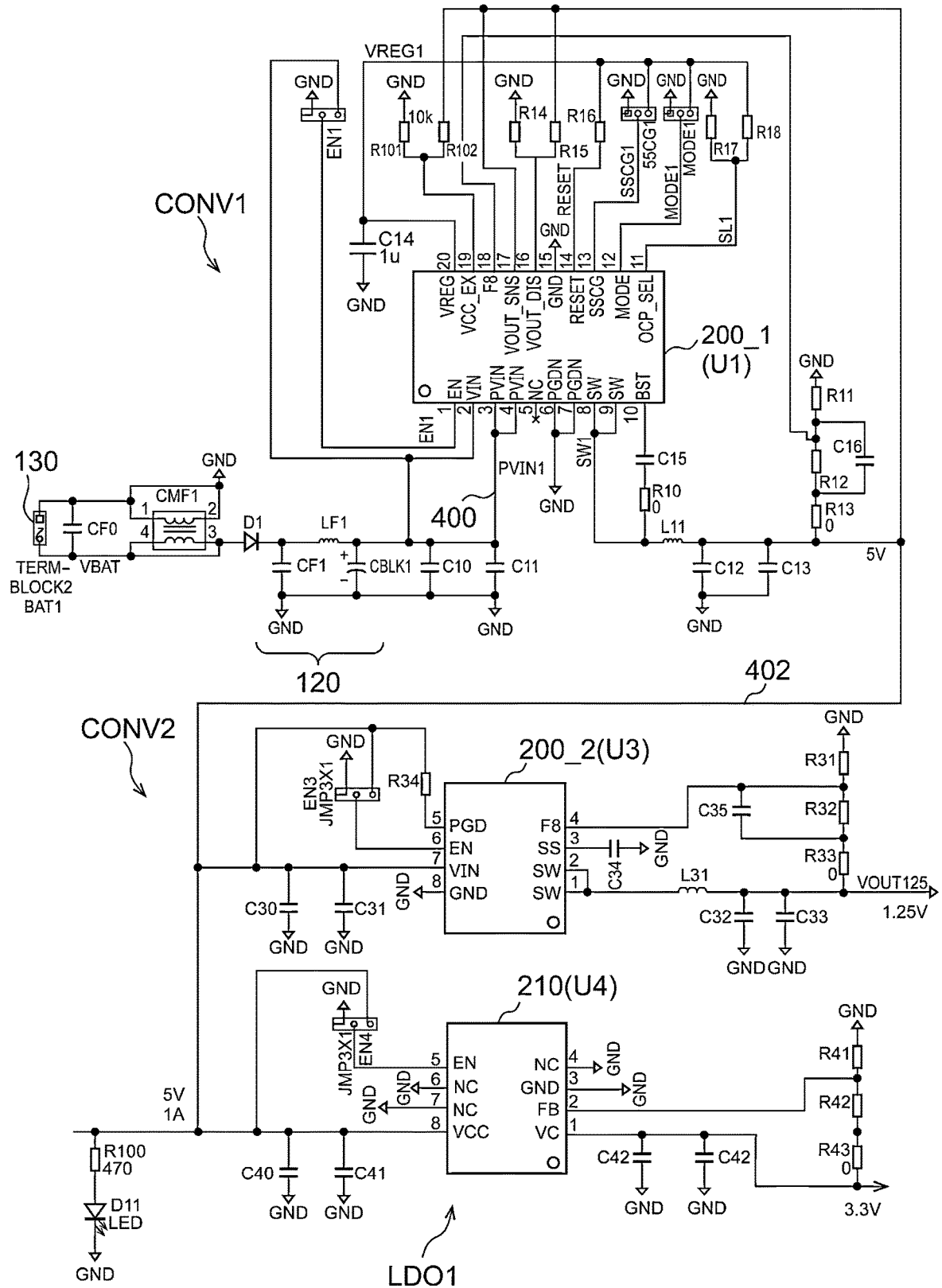
FIG. 7 is an equivalent circuit diagram of a switching power supply according to an embodiment.

FIG. 7 is an equivalent circuit diagram showing a switching power supply 100A according to an embodiment. The switching power supply 100A includes a first DC/DC converter CONV1, a second DC/DC converter CONV2, and a linear regulator LDO1. Each DC/DC converter CONV# (#=1, 2) includes a control circuit 200_# and a peripheral circuit component group 110_#. Furthermore, the linear regulator LDO1 includes a regulator IC 210 and a peripheral circuit component group.

For example, as the controller circuit 200_1 (U1), a controller IC (BD9P205EFV) manufactured by ROHM Co., Ltd. is employed for controlling a synchronous rectification step-down DC/DC converter. As the control circuit 200_2 (U3), a controller IC (BD9S201NUX) manufactured by the same company is employed. The control circuits 200_1 and 200_2 are each provided with pins that are not shown in FIG. 2. However, such pins have no relation with the present disclosure. Accordingly, description thereof will be omitted. A data sheet is available for each IC as necessary. As the regulator IC 210 (U4), BD00IA5MEF manufactured by ROHM Co., Ltd. is employed.

The first DC/DC converter CONV1 receives a battery voltage as its input voltage, and steps down the battery voltage thus received. The second DC/DC converter CONV2 receives the output volage of the first DC/DC converter CONV1, and further steps down the voltage thus received so as to stabilize the output voltage to 1.25 V. Furthermore, the linear regulator LDO1 receives the output voltage of the first DC/DC converter CONV1 as its input voltage, and stabilizes the voltage thus received to 3.3 V.

In the switching power supply 100A shown in FIG. 7, a first DC line 400 that extends from the input connector 130 to the input pin PVIN of the control circuit 200_1, a second DC line 402 that extends from the output of the first DC/DC converter CONV1 to the input pin of the second DC/DC converter CONV2, and a third DC line 404 configured as an output line of the second DC/DC converter CONV2 each correspond to a DC line to be subjected to a noise countermeasure. In addition, a DC voltage is supplied through an output line 406 of the linear regulator LDO. Accordingly, the noise countermeasure may be applied to the output line 406.

Figure 8:
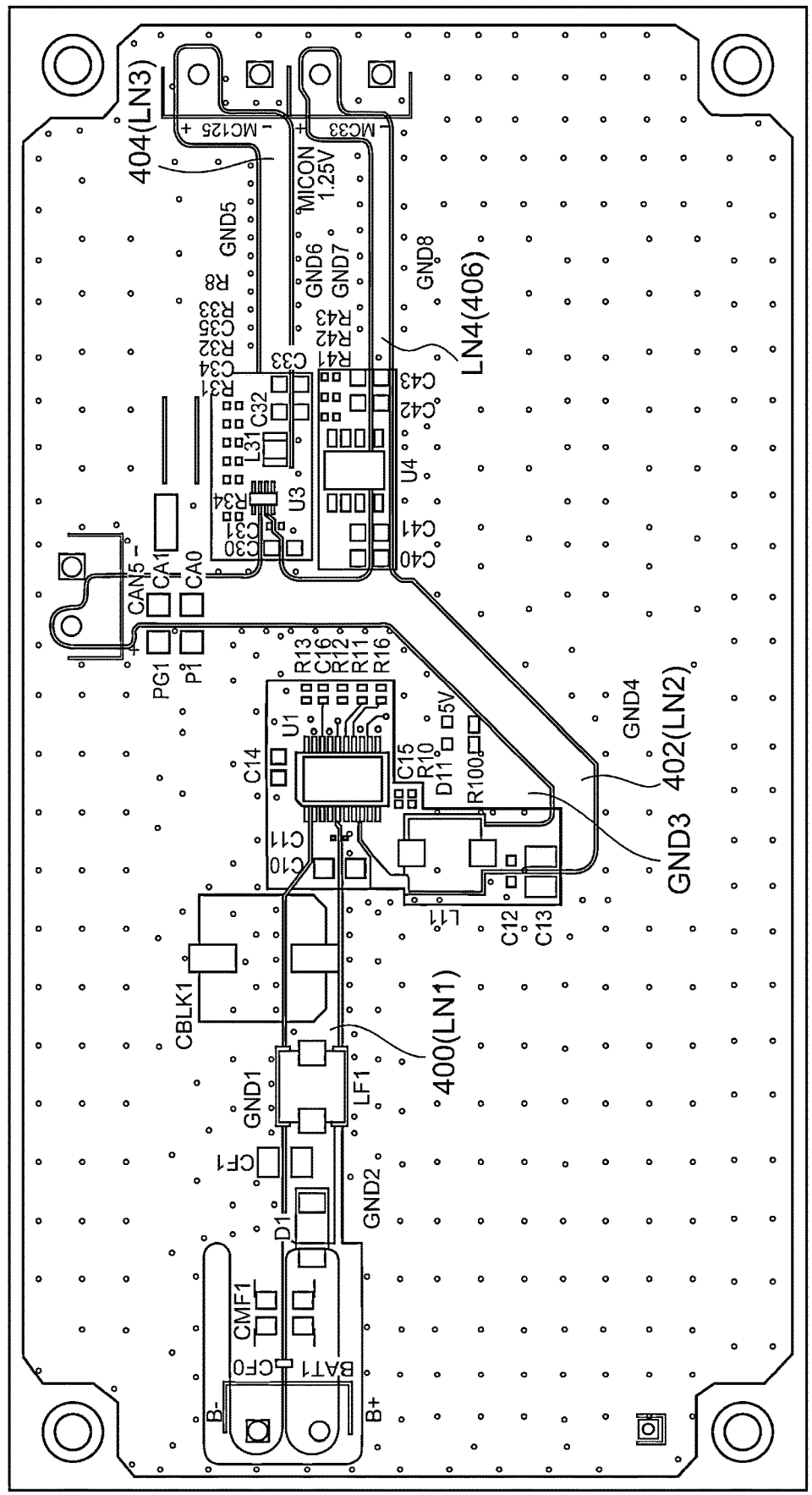
FIG. 8 is a diagram showing a printed circuit board mounting the switching power supply shown in FIG. 7.

FIG. 8 is a diagram showing a printed circuit board 300A mounting the switching power supply 100A shown in FIG. 7. The DC lines 400, 402, and 404 shown in FIG. 7 each have the wiring structure shown in FIG. 3, and are denoted by LN1, LN2, and LN3, respectively. Each DC line is subjected to the noise countermeasure. From among the DC lines LN1, LN2, and LN3, the first DC line LN1, which is an input line of the most upstream power supply (closest to the battery), i.e., the first DC/DC converter CONV1, is most susceptible to noise. Accordingly, the first DC line LN1 may preferably be provided with via holes arranged at a narrower pitch than those provided to the other lines.

A first ground region GND1 and a second ground region GND2 are formed such that the first DC line LN1 is interposed between them. Furthermore, a third ground region GND3 and a fourth ground region GND4 are formed such that the second DC line LN2 is interposed between them. A lower-layer ground region (not shown) is formed in the second wiring layer such that it overlaps the ground regions described above.

Furthermore, a fifth ground region GND5 and a sixth ground region GND6 are formed such that the third DC line LN3 is interposed between them.

Moreover, a seventh ground region GND7 and an eighth ground region GND8 are formed such that a fourth DC line LN4 that corresponds to the output line 406 of the linear regulator is interposed between them.

Several ground regions may be continuously formed as a single ground region. In this example, all the ground regions GND1 through GND8 are continuously formed in the first wiring layer.

Components CF1, LF1, and CBLLK1 are provided on the path of the first DC line 400 so as to form an input filter. The noise that occurs in the control circuit 200_1 is blocked by the input filter. Accordingly, directing attention to the pitches of the through holes in the ground region adjacent to the first DC line 400, the pitch on the upstream side of the input filter is designed to be wider than that on the downstream side of the input filter. By widening the pitch, this allows the number of through holes to be reduced. In some cases, this contributes to reduction of the cost of the printed circuit board 300A.

Next, description will be made regarding noise measurement results.

Figure 9:
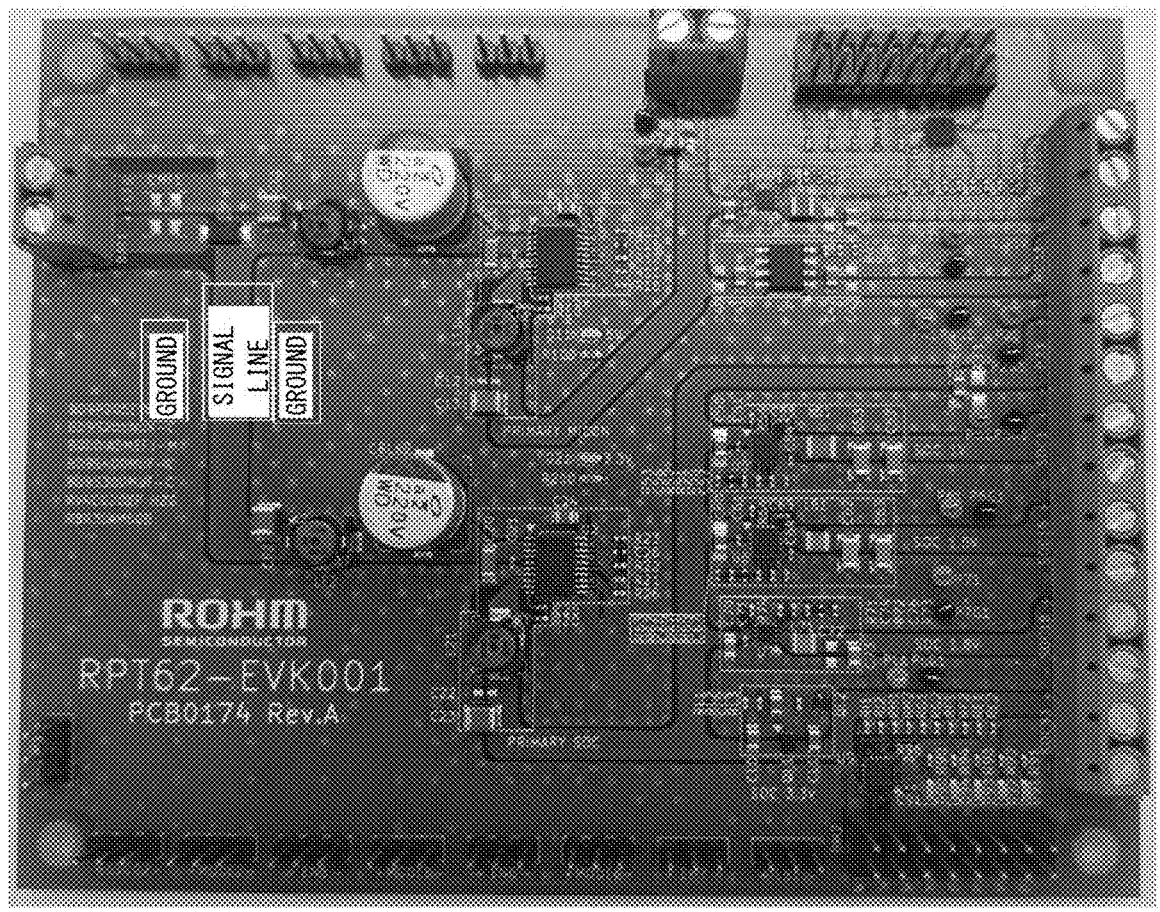
FIG. 9 is a photograph of a printed circuit board mounting the switching power supply manufactured in accordance with the structure described in the embodiment.
Figure 10A:
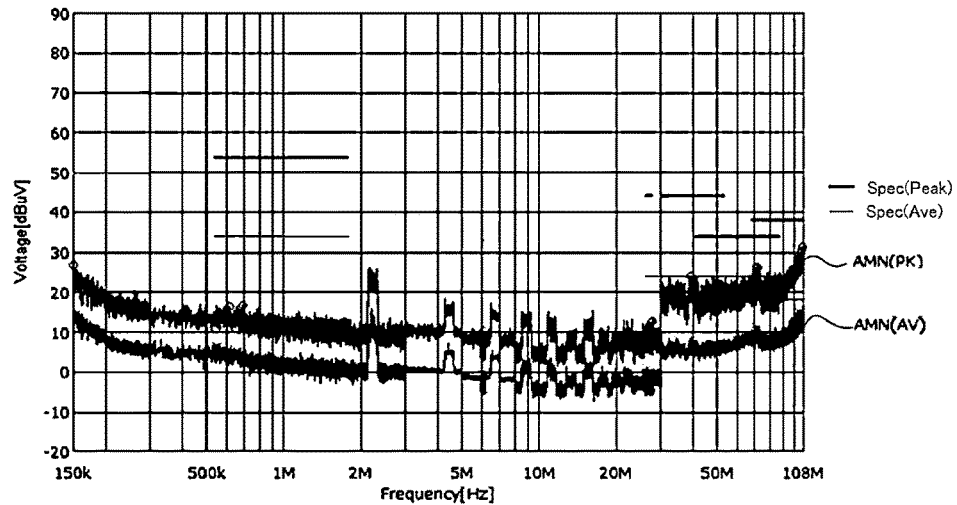
FIGS. 10A through FIG. 10C are diagrams showing noise measurement results of the switching power supply shown in FIG. 9.
Figure 10B:
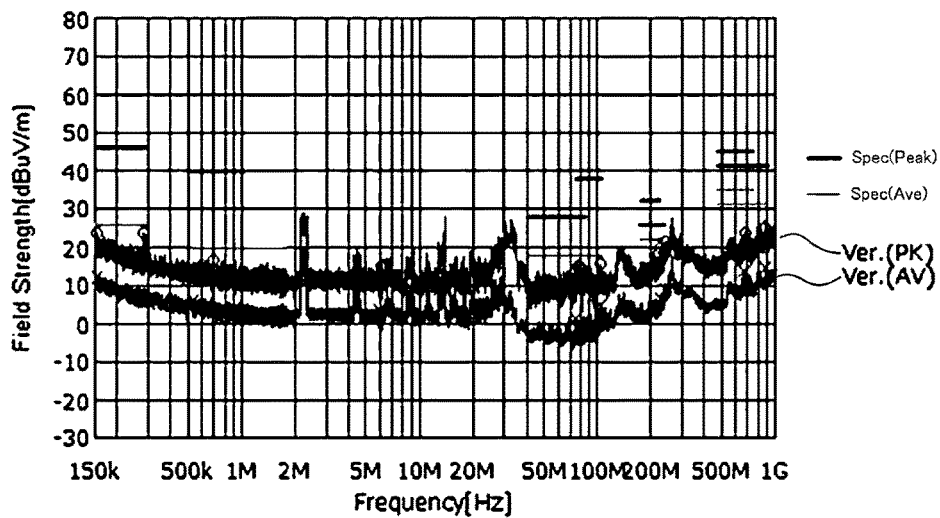
Figure 10C:
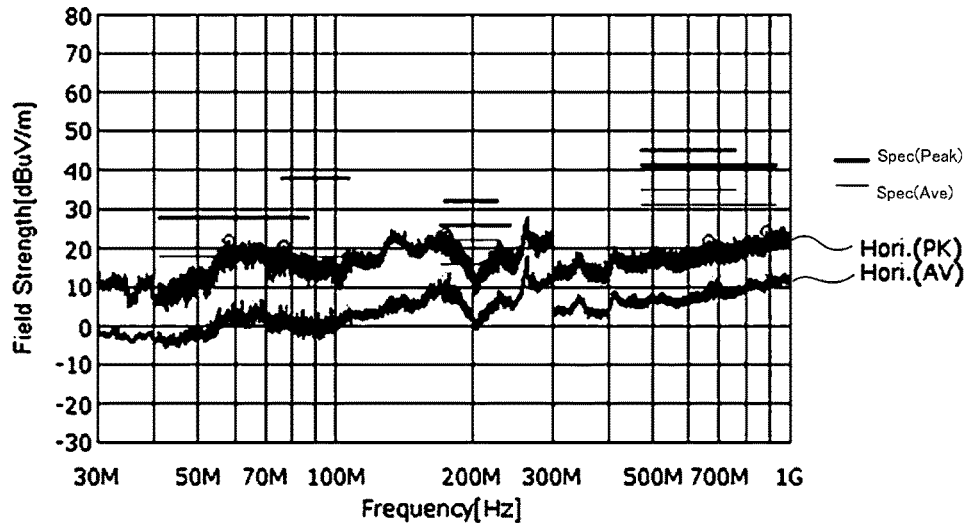

FIG. 9 is a photograph of the switching power supply manufactured based on the structure described in the embodiment. An arrangement that conforms to the circuit board layout shown in FIG. 8 is shown in the upper-half part of FIG. 9. FIGS. 10A through FIG. 10C are diagrams showing noise measurement results of the switching power supply shown in FIG. 9. FIG. 10A shows measurement results of conduction noise (peak value AMN(PK)). FIG. 10B shows measurement results of radiation noise in the vertical direction with respect to the antenna plane (peak value Ver.(PK) and average value Ver.(AV)). FIG. 10C shows measurement results of radiation noise in the horizontal direction with respect to the antenna plane (peak value Hori.(PK) and average value Hori.(AV)). In FIGS. 10A through FIG. 10C, the standard values defined in CISPR 25 are shown together with the measurement results.

As shown in FIGS. 10A through FIG. 10C, the measurement values of noise satisfy the standard values defined in the standard for all the items.

Description has been made above regarding the present disclosure with reference to the embodiments. The above-described embodiments have been described for exemplary purposes only and are by no means intended to be interpreted restrictively. Rather, it can be readily conceived by those skilled in this art that various modifications may be made by making various combinations of the aforementioned components or processes, which are also encompassed in the technical scope of the present disclosure. Description will be made below regarding such modifications.

Description has been made in the embodiments regarding an arrangement in which the switching power supply is configured as a step-down converter. However, the present invention is not restricted to such an arrangement. Also, the switching power supply may be configured as a step-up converter or a step-up/step-down converter. Also, the switching power supply may be configured as a switching power supply employing a transformer. The present invention is not restricted to DC/DC converters. Rather, the present invention is widely applicable to various kinds of switching power supplies having a switching element such as converters, inverters, AC/DC converters, etc.

Description has been made in the embodiment regarding an arrangement in which the switching transistor M1 and the synchronous rectification transistor M2 are integrated in the control circuit 200. Also, such components may each be configured as a discrete element. Also, such discrete components may be mounted on a printed circuit board. In this case, the switching transistor and the synchronous rectification transistor are included in the peripheral circuit component group.

Description has been made regarding the present disclosure with reference to the embodiments using specific terms. However, the above-described embodiments show only an aspect of the mechanisms and applications of the present invention. Rather, various modifications and various changes in the layout can be made without departing from the spirit and scope of the present invention defined in appended claims.

What is claimed is:

1. A switching power supply comprising:
a printed circuit board having a multilayer structure comprising a first wiring layer structured as a surface layer, an insulating layer, and a second wiring layer;
a control circuit mounted on the printed circuit board; and
a peripheral circuit component group mounted on the printed circuit board,
wherein the first wiring layer comprises:
a DC line via which a DC voltage is supplied; and
a first ground region and a second ground region each formed so as to be at a distance from the DC line such that the DC line is interposed between them,
wherein the second wiring layer comprises a lower-layer ground region formed such that it overlaps the DC line, the first ground region, and the second ground region;
and wherein the insulating layer includes:
a plurality of first through holes provided along one side of the first ground region that faces the DC line so as to electrically connect the first ground region and the lower-layer ground region; and
a plurality of second through holes provided along one side of the second ground region that faces the DC line so as to electrically connect the second ground region and the lower-layer ground region, wherein, with the speed of light in a vacuum as c, with a maximum frequency defined in a specification with respect to noise as $f_{MAX}$, and with the relative dielectric constant of the insulating layer as $\varepsilon_r$, a maximum value $d_{max}$ of pitches of the first through holes and the second through holes is determined such that $d_{max} < (c/(f_{MAX} \cdot \sqrt{\varepsilon_r}))/10$ is satisfied.

2. A switching power supply comprising:
a printed circuit board having a multilayer structure comprising a first wiring layer structured as a surface layer, an insulating layer, and a second wiring layer;
a control circuit mounted on the printed circuit board; and
a peripheral circuit component group mounted on the printed circuit board,
wherein the first wiring layer comprises:
a DC line via which a DC voltage is supplied; and
a first ground region and a second ground region each formed so as to be at a distance from the DC line such that the DC line is interposed between them,
wherein the second wiring layer comprises a lower-layer ground region formed such that it overlaps the DC line, the first ground region, and the second ground region;
and wherein the insulating layer includes:
a plurality of first through holes provided along one side of the first ground region that faces the DC line so as to electrically connect the first ground region and the lower-layer ground region; and
a plurality of second through holes provided along one side of the second ground region that faces the DC line so as to electrically connect the second ground region and the lower-layer ground region,
wherein the DC line is configured as an input line of the switching power supply,
and wherein the switching power supply further comprises an input filter provided on a path of the input line,
wherein the pitches of the first through holes and the second through holes on an upstream side of the input filter are designed to be wider than those on a downstream side of the input filter.

3. The switching power supply according to claim 1, wherein a minimum value $d_{min}$ of the pitches is determined such that that $(c/(f_{MAX} \cdot \sqrt{\varepsilon_r}))/100 < d_{min}$ is satisfied.

4. The switching power supply according to claim 1, wherein the DC line is configured as an input line of the switching power supply.

5. The switching power supply according to claim 4, further comprising an input filter provided on a path of the input line,
wherein the pitches of the first through holes and the second through holes on an upstream side of the input filter are designed to be wider than those on a downstream side of the input filter.

6. The switching power supply according to claim 1, wherein the switching power supply is configured as a step-down DC/DC converter.

7. A switching power supply comprising:
a printed circuit board having a multilayer structure comprising a first wiring layer structured as a surface layer, an insulating layer, and a second wiring layer;
a first control circuit mounted on the printed circuit board; and
a first peripheral circuit component group mounted on the printed circuit board, so as to form a first DC/DC converter together with the first control circuit;
a second control circuit mounted on the printed circuit board; and
a second peripheral circuit component group mounted on the printed circuit board, so as to form a second DC/DC converter together with the second control circuit,
wherein an output voltage of the first DC/DC converter is supplied to an input terminal of the second DC/DC converter,
wherein the first wiring layer comprises:
a first DC line via which an input voltage of the first DC/DC converter is supplied; and
a first ground region and a second ground region each formed so as to be at a distance from the first DC line such that the first DC line is interposed between them;
a second DC line that couples an output terminal of the first DC/DC converter and an input terminal of the second DC/DC converter;
a third ground region and a fourth ground region each formed so as to be at a distance from the second DC line such that the second DC line is interposed between them;
wherein the second wiring layer comprises a lower-layer ground region formed such that it overlaps the first DC line, the first ground region, the second ground region, the second DC line, the third ground region, and the fourth ground region,
and wherein the insulating layer includes:
a plurality of first through holes provided along one side of the first ground region that faces the first DC line so as to electrically connect the first ground region and the lower-layer ground region;
a plurality of second through holes provided along one side of the second ground region that faces the first DC line so as to electrically connect the second ground region and the lower-layer ground region;
a plurality of third through holes provided along one side of the third ground region that faces the second DC line so as to electrically connect the third ground region and the lower-layer ground region; and
a plurality of fourth through holes provided along one side of the fourth ground region that faces the second DC line so as to electrically connect the fourth ground region and the lower-layer ground region.

8. The switching power supply according to claim 7, wherein, with the speed of light in a vacuum as c, with a maximum frequency defined in a specification with respect to noise as $f_{MAX}$, and with the relative dielectric constant of the insulating layer as $\varepsilon_r$, a maximum value $d_{max}$ of pitches of the first through holes, the second through holes, the third through holes, and the fourth through holes is determined such that $d_{max} < (c/(f_{MAX} \cdot \sqrt{\varepsilon_r}))/10$ is satisfied.

* * * * *